United States Patent [19]

VanValkenburg

[11] 4,420,707

[45] Dec. 13, 1983

[54] BACKING FOR ULTRASONIC TRANSDUCER CRYSTAL

[75] Inventor: Howard E. VanValkenburg, New Fairfield, Conn.

[73] Assignee: Automation Industries, Inc., Greenwich, Conn.

[21] Appl. No.: 406,122

[22] Filed: Aug. 9, 1982

[51] Int. Cl.[3] .............................................. H01L 41/08

[52] U.S. Cl. .................................................... 310/327

[58] Field of Search .................. 310/327; 73/632, 642, 73/644, DIG. 4

[56] References Cited

U.S. PATENT DOCUMENTS

| | | | |
|---|---|---|---|
| 3,376,438 | 4/1968 | Colbert | 310/327 |
| 3,794,866 | 2/1974 | McElroy et al. | 310/327 |
| 3,810,385 | 5/1974 | McFaul et al. | 310/327 X |
| 3,925,692 | 12/1975 | Leschek et al. | 310/327 |
| 3,935,484 | 1/1976 | Leschek et al. | 310/327 |

*Primary Examiner*—Mark O. Budd
*Attorney, Agent, or Firm*—Francis N. Carten

[57] ABSTRACT

A disk of porous sintered metal is employed as the backing material for the piezoelectric crystal in an ultrasonic transducer.

4 Claims, 1 Drawing Figure

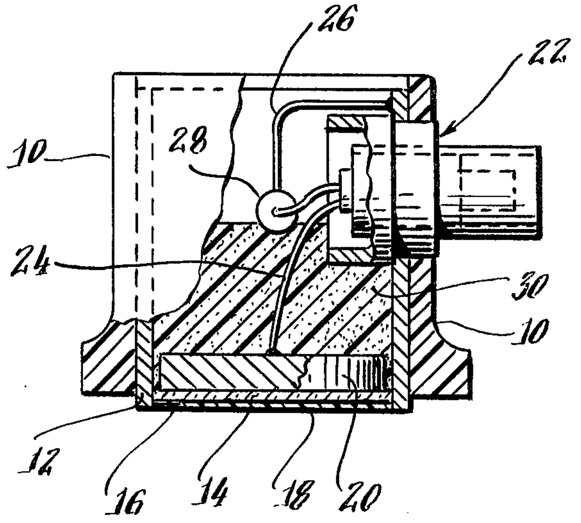
26
22
10
28
24
30
10
12
16
14
18
20

BACKING FOR ULTRASONIC TRANSDUCER CRYSTAL

TECHNICAL FIELD

This invention relates to ultrasonic transducers of the type employed in non-destructive testing. More particularly, it pertains to a novel backing material for the ultrasonic crystal employed in such a transducer.

BACKGROUND ART

U.S. Pat. No. 2,398,701 F. A. Firestone pertains to circuits for ultrasonic non-destructive testing wherein piezoelectric crystals are employed for both transmitting and receiving ultrasonic energy. Page 2 of that patent in the second column, lines 26–42, explains the necessity for a damping means on the back of the crystal in order to prevent "ringing" after the crystal is energized by a short pulse of ultrasonic frequency. Firestone suggests the use of a material such as Bakelite or lead for absorbing the ultrasonic energy. In U.S. Pat. No. 2,707,755 of Hardie et al., there is disclosed as a damping material a plastic matrix containing particles of metal (such as aluminum) or bubble inclusions. The plastic or particle density is graded so as to be greatest near the crystal for maximum energy transfer from the crystal into the damping material and becoming less dense with increasing distance so as to absorb the energy. Still later U.S. Pat. No. 2,972,068 of Howry et al. proposes as a backing material a synthetic resin containing a high concentration of a fine powder of heavy metal.

All of the proposed prior art backing materials have shortcomings which it is desirable to overcome. These include difficulty of fabrication, poor thermal, chemical, and mechanical stability, tendencies to shrink and creep, and problems of reproducibility. Furthermore, they are not usually electrically conducting.

DISCLOSURE OF INVENTION

The invention comprises the use of porous sintered metal as a backing material for the piezoelectric crystal in an ultrasonic transducer.

BRIEF DESCRIPTION OF DRAWING

The single FIGURE of the drawing is an elevational view of an ultrasonic transducer in accordance with this invention, partially cut away to illustrate its internal construction.

BEST MODE FOR CARRYING OUT THE INVENTION

Referring to the single FIGURE of the drawing, there is illustrated a transducer in accordance with the invention. The transducer includes a housing 10 which is essentially cylindrical and formed from an electrically insulating material such as a plastic. Carried within housing 10 and extending slightly beyond its lower surface is an electrically metal shell 12. An ultrasonic transducer element 14, such as a disk of piezoelectric crystal, is enclosed by the shell 12. The element 14 has a conductive metal coating on each of its two planar surfaces. The outermost surface of element 14 is connected to shell 12 by means of a conductor 16 which may be a wire or foil. The element 14 is of slightly smaller diameter than the inside diameter of shell 12. This avoids electrical contact between the inner surface of element 14 and the shell 12. The lower surface of the element 14 is protected by an abrasion resistant wear plate 18, such as aluminum oxide.

Mounted against the inner surface of element 14 in electrical contact with its metallic plating is a backing disk 20 of porous sintered metal. A coaxial connector 22 of conventional construction extends through the sides of the housing 10 and shell 12. One lead 24 from connector 22 is electrically connected to the back of the backing disk 20 and the other lead 26 is connected to shell 12 through a tuning inductor 28. The space above and surrounding the element 14 and backing disk 20 is filled with a suitable encapsulating material 30.

The novel feature of this invention resides in the use of a porous sintered metal disk as backing for an ultrasonic crystal. Such a disk has the advantage of being readily machinable and electrically conductive. Furthermore, it is highly stable in that it is rigid, without shrinkage or creep, and is sonically very attenuative. The attenuation varies with frequency and material but is also variable by pore size which is well controlled by sintered metal fabricators. Furthermore, the backing may be of a metal such as stainless steel so as to be non-corrosive and have substantially infinite life.

The backing disk 20 is normally bonded to the element 14 by a very thin layer of adhesive. This adhesive layer is sufficiently thin to assure electrical contact. The sintered porous metal backing disk may have a thickness only approximately ten times that of the crystal. This is substantially thinner than backings required in the prior art for equivalent operating conditions. It has been found, for example, that a backing disk of approximately 0.2 inch thickness is adequate to absorb easily 5 megahertz sound. Larger pore sizes such as 100 microns are especially attenuative at lower frequencies. At higher frequencies, smaller pore sizes may be employed.

The following table sets forth the ultrasonic properties of porous stainless steel disks one inch in diameter and $\frac{1}{8}$ inch thick. These disks were obtained from Mott Metallurgical Corporation, Farmington, Connecticut.

| Nominal Pore Size | Density ($\rho$) | Velocity (v) | Relative Impedance ($\rho$v) |
|---|---|---|---|
| microns | gm/cc | cm/sec | — |
| 0.5 | 6.74 | $4.4 \times 10^5$ | $29.7 \times 10^6$ |
| 2 | 5.53 | 3.4 | 18.8 |
| 5 | 5.35 | 3.2 | 17.1 |
| 10 | 4.91 | 3.2 | 15.7 |
| 20 | 4.66 | 2.9 | 13.5 |
| 100 | 3.67 | 2.6 | 9.5 |

Set forth below are the attenuations of similar disks at 2.25 megahertz relative to non-attenuating disks of comparable size.

| Nominal Pore Size | Attenuation |
|---|---|
| 0.5$\mu$ | 14 dB |
| 2 | 18 |
| 20 | 36 |
| 40 | 40 |
| 100 | 70 |

Therefore it can be seen that by proper selection of pore size and backing thickness, the required attenuation for a given frequency may be obtained.

It is believed that the many advantages of this invention will now be apparent to those skilled in the art. It will also be apparent that a number of variations and modifications may be made therein without departing from its spirit and scope. For example, the shape of the backing material need not be limited to disks. Accordingly, the foregoing description is to be construed as illustrative only, rather than limiting. This invention is limited only by the scope of the following claims.

What is claimed is:

1. An electroacoustic transducer for ultrasonic inspection systems and the like which comprises:

a piezoelectric element having front and back faces; and a rigid plate in intimate contact with the back face of the crystal having high ultrasonic energy attenuation characteristics, said plate being formed substantially solely of porous sintered metal.

2. The transducer of claim 1 wherein said rigid plate makes electrical contact with said back face.

3. The transducer of claim 1 or 2 wherein said metal is stainless steel.

4. The transducer of claim 1 or 2 wherein said plate is a disk.

* * * * *